(12) United States Patent  
Ivanov et al.

(10) Patent No.: US 7,114,643 B2
(45) Date of Patent: Oct. 3, 2006

(54) FRICTION FIT TARGET ASSEMBLY FOR HIGH POWER SPUTTERING OPERATION

(75) Inventors: Eugene Y. Ivanov, Grove City, OH (US); Harry W. Conard, Orient, OH (US)

(73) Assignee: Tosoh SMD, Inc., Grove City, OH (US)

( * ) Notice: Subject to any disclaimer, the term of this patent is extended or adjusted under 35 U.S.C. 154(b) by 135 days.

(21) Appl. No.: 10/433,242

(22) PCT Filed: Dec. 13, 2001

(86) PCT No.: PCT/US01/48480

§ 371 (c)(1),
(2), (4) Date: May 28, 2003

(87) PCT Pub. No.: WO02/47865

PCT Pub. Date: Jun. 20, 2002

(65) Prior Publication Data

US 2004/0035698 A1    Feb. 26, 2004

Related U.S. Application Data

(60) Provisional application No. 60/256,110, filed on Dec. 15, 2000.

(51) Int. Cl.
*B23K 31/02* (2006.01)
*B23K 20/12* (2006.01)

(52) U.S. Cl. .................... 228/115; 228/112.1; 228/114; 228/116; 228/171

(58) Field of Classification Search ................ 228/115, 228/112.1, 114, 116, 171, 173.2; 204/298.12, 204/298.13
See application file for complete search history.

(56) References Cited

U.S. PATENT DOCUMENTS 5,143,590 A    9/1992    Strothers et al.
5,269,899 A   12/1993    Fan
5,487,822 A    1/1996    Demaray et al.
5,693,203 A   12/1997    Ohhashi et al.
5,836,506 A   11/1998    Hunt et al.
6,073,830 A    6/2000    Hunt et al.
6,725,522 B1 *  4/2004   Ivanov et al. .................. 29/525
6,749,103 B1 *  6/2004   Ivanov et al. ................ 228/115

FOREIGN PATENT DOCUMENTS

WO    PCT/US95/13621    10/1996

* cited by examiner

*Primary Examiner*—Len Tran
(74) *Attorney, Agent, or Firm*—Wegman, Hessler & Vanderburg

(57) ABSTRACT

The present application pertains to unconventional sputter target/backing plate assemblies (10) for high power operation and to the low temperature method of making them. The sputter target/backing plate assemblies (10) comprise targets (12) and backing plates (16) having dissimilar thermal coefficients of expansion. Although the consolidated targets (12) and backing plates (16) have dissimilar thermal coefficients of expansion, they are able to be bonded together and used at high sputtering temperatures without bowing or bending and are able to utilize backing plates (16) normally associated with a specified target metal. In the method of making, a plurality of male projections (16) are formed in one member of the assembly (10) with a plurality of corresponding female grooves (32) formed in the other surface. The assembly (10) is bonded by conventional techniques around an annular zone that surrounds the male (26) and female portions (32). The assembly (10) is then pressure consolidated at low temperature so that the projections are force fit into the female recesses.

9 Claims, 4 Drawing Sheets

FRICTION FIT TARGET ASSEMBLY FOR HIGH POWER SPUTTERING OPERATION

CROSS-REFERENCE TO RELATED APPLICATIONS

Priority filing benefit of (1) international PCT application PCT/US01/48480 filed Dec. 13, 2001, and published under PCT 21(2) in the English language; and (2) U.S. Provisional application Ser. No. 60/256,110 filed Dec. 15, 2000.

FIELD OF THE INVENTION

The present application pertains to sputter target/backing plate assemblies for high power operation and to the low temperature method of making them.

BACKGROUND OF THE INVENTION

Cathodic sputtering is widely used for the deposition of thin layers of material onto desired substrates. Basically, this process requires gas ion bombardment of a target having a face formed of a material that is to be deposited as a thin film or layer on a substrate. Ion bombardment of the target not only causes atoms or molecules of the target material to be sputtered, but imparts considerable thermal energy to the target. This heat is dissipated by use of a cooling fluid typically circulated beneath or around a heat conducting backing plate that is positioned in heat exchange relation with the target.

The target forms a part of a cathode assembly which together with an anode is placed in an evacuated chamber that contains an inert gas, preferably argon. A high voltage electrical field is applied across the cathode and anode. The inert gas is ionized by collision with the electrons ejected from the cathode. Positively charged gas ions are attracted to the cathode and, upon impingement with the target surface, dislodge the target material. The dislodged target materials traverse the evacuated enclosure and deposit as a thin film on the desired substrate that is normally located proximate the anode.

In addition to the use of an electrical field, increasing sputtering rates have been achieved by the concurrent use of an arch-shaped magnetic field that is superimposed over the electrical field and formed in a closed loop configuration over the surface of the target. These methods are known as magnetron sputtering methods. The arch-shaped magnetic field traps electrons in an annular region adjacent the target surface thereby increasing the number of electron-gas atom collisions in the area to produce an increase in the number of positively charged gas ions in the region that strike the target to dislodge the target material. Accordingly, the target material becomes eroded (i.e., consumed for subsequent deposition on the substrate) in a generally annular section of the target face, known as the target raceway.

In typical target cathode assemblies, the target is attached to a nonmagnetic backing plate. The backing plate is normally water-cooled to carry away the heat generated by the ion bombardment of the target. Magnets are typically arranged beneath the backing plate in well-known disposition in order to form the above-noted magnetic field in the form of a loop or tunnel extending around the exposed face of the target.

In order to achieve good thermal and electrical contact between the target and backing plate, these members are commonly attached to each other by means of soldering, brazing, diffusion bonding, clamping and by epoxy cement and the like. However, sputter target assemblies bonded by these methods can bow or bend at high sputtering temperatures, especially when a large difference exists between the coefficients of thermal expansion for the target and backing plate. In many cases, in order to minimize bowing and bending of the plates at high sputtering conditions, targets and backing plates having similar thermal expansion coefficients are bonded together.

In many situations, the targets and backing plates can be diffusion bonded. However, with regard specifically to diffusion bonding that is carried out in HIP cans, HIP cans may leak during the HIP process thereby preventing or diminishing metal target bonding to a backing plate due to contamination or residual air in the HIP can.

Additionally, the high temperatures that can be associated with some of the above disclosed bonding methods can result in undesirable grain growth in the target metal.

The present invention pertains to a low temperature bonding method which provides for the consolidation of sputter target/backing plate assemblies. These sputter target/backing plate assemblies are comprised of targets and backing plates having dissimilar thermal expansion coefficients. Although the target and backing plate have dissimilar thermal expansion coefficients, the method allows these unconventional assemblies to be bonded together and used at high sputtering temperatures without significant bowing or bending. As a result, these sputter target assemblies are able to utilize backing plates having higher thermal and lower electrical conductivity than the conventional backing plates normally associated with a specified target metal. Lastly, this method allows for the target assembly to minimize grain growth in the target metal due to consolidation at a low temperature.

SUMMARY OF THE INVENTION

In this invention, a target and backing plate are provided wherein both are machined or otherwise formed so as to have a plurality of projections and grooves or other salient surface portions thereof. Notably, machining of the projections, or salient portions, is not limited necessarily to the target or backing plate with the hardest surface. These projections, or salient portions, are formed along the interior surface of the target or backing plate. The projected surface is then placed alongside the mating surface (having appropriately positioned mating members) of the other member of the assembly along the target/backing plate interface wherein joining will occur.

The peripheral boundary of the interfacial surface assembly is joined by conventional means such as electron beam welding, TIG welding, friction welding, soldering, brazing, etc., preferably under vacuum. The assembly is then pressed at a low temperature, preferably at room temperature.

The projections formed along either the target or backing plate penetrate into the mating members along the target/backing plate interface. The projections penetrate into the grooves on the opposing mating surface. The projections and grooves have different sizes so that after penetration, a force or friction fit joint will be formed.

This low temperature bonding method enables consolidation of unconventional sputter target/backing plate assemblies. These sputter target/backing plate assemblies are unconventional insofar as they comprise targets and backing plates having dissimilar thermal expansion coefficients. For example, the difference between thermal expansion coefficients (TEC) of the target and backing plate may be greater than about 2.4, and preliminary data suggests that targets and backing plates having differences in TEC's of greater than 4 can also be successfully bonded and then used in high power 20–30 kw sputtering processes. In such processes, target temperatures may reach about 200°–300° C. An optional metal insert may be placed between the target and backing plate during the assembly process.

With respect specifically to Ti targets, diffusion bonding in prior art has been limited to conventional AL 6061 backing plates which have low thermal conductivity. In contrast, one such preferred assembly formed by the instant method is a Ti target or alloys thereof having an unconventional Cu-1% Cr backing plate and a Cu—Ni insert placed adjacent the peripheral boundary of the assembly.

In this preferred unconventional assembly, the Ti target and Cu-1% Cr backing plate have different thermal expansion coefficients with Cu-1% Cr being about 17.6 and Ti being about 8.9. Although the thermal expansion coefficients are dissimilar, the bonded assembly does not substantially separate and/or bow during high power level sputtering conditions. As a result, this unconventional assembly is able to utilize the Cu-1% Cr backing plate which has higher thermal conductivity and lower electrical conductivity then the conventional AL 6061 backing plate.

Additionally, the Cu—Ni insert used in the preferred assembly also has a low electrical conductivity which decreases the eddy current and has reasonably high heat conductivity allowing use in high power applications. Accordingly, this Cu—Ni insert also can be used as a backing plate that can be bonded to a Ti target and alloys thereof under the low temperature methods disclosed herein to form an unconventional high power sputter target/backing plate assembly.

Other high power sputter target/backing plate combinations that successfully can be bonded at low temperatures have been found to be those comprising a Co target or alloys thereof bonded to a Cu-1% Cr backing plate, or a Ta target or alloys thereof bonded to a Ti or a Ti alloy backing plate.

Other objects and advantages of the invention will be apparent from the following description, the accompanying drawings and the appended claims.

DETAILED DESCRIPTION OF THE PREFERRED EMBODIMENT

Figure 1:
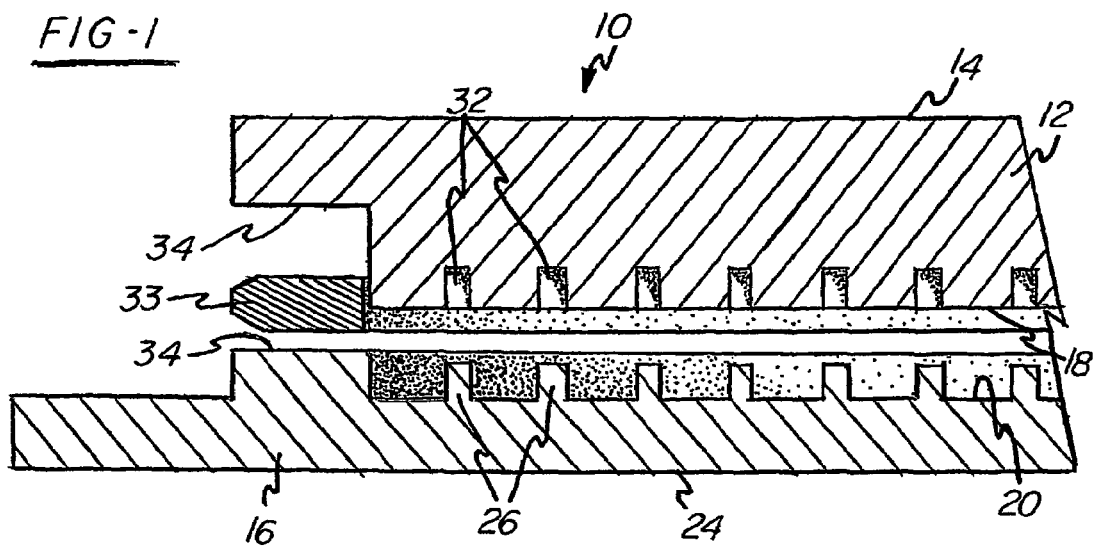
FIG. 1 is a schematic cross sectional view of a target and backing plate assembly showing the friction fit joining mechanisms in the form of cylindrical male projections ready for insertion into cylindrical bores.

Turning first to FIG. 1 there is shown a target/backing plate assembly 10. The assembly 10 comprises a target 12 having a top side 14 carrying metal or metal alloy that, in accordance with conventional sputtering methods, will be ejected from the target 12 via ionic bombardment and will travel to and coat the desired substrate (not shown).

Figure 3:
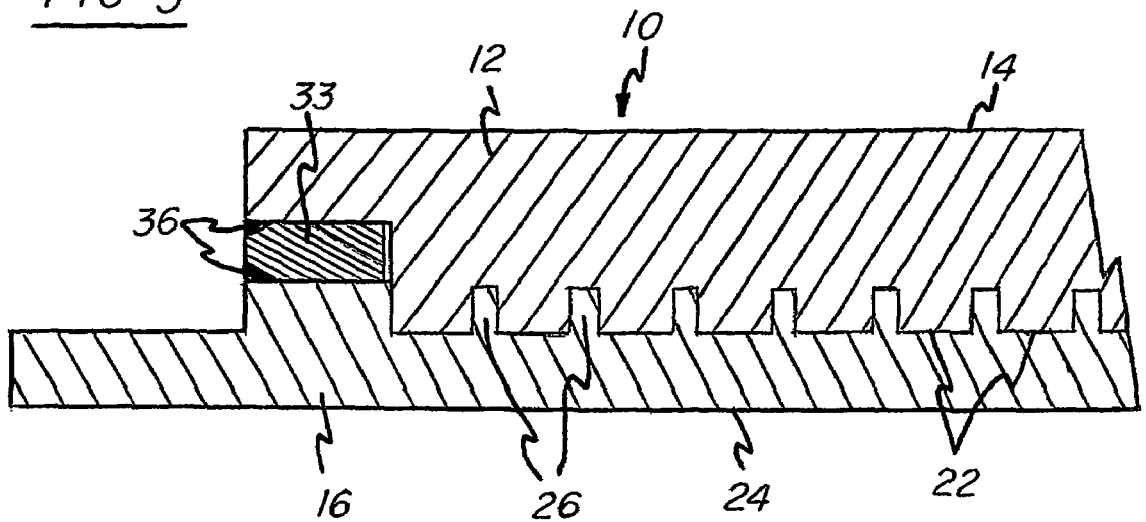
FIG. 3 is a schematic cross sectional view of the assembly shown in FIG. 1 in the mating or joined position.
Figure 4:
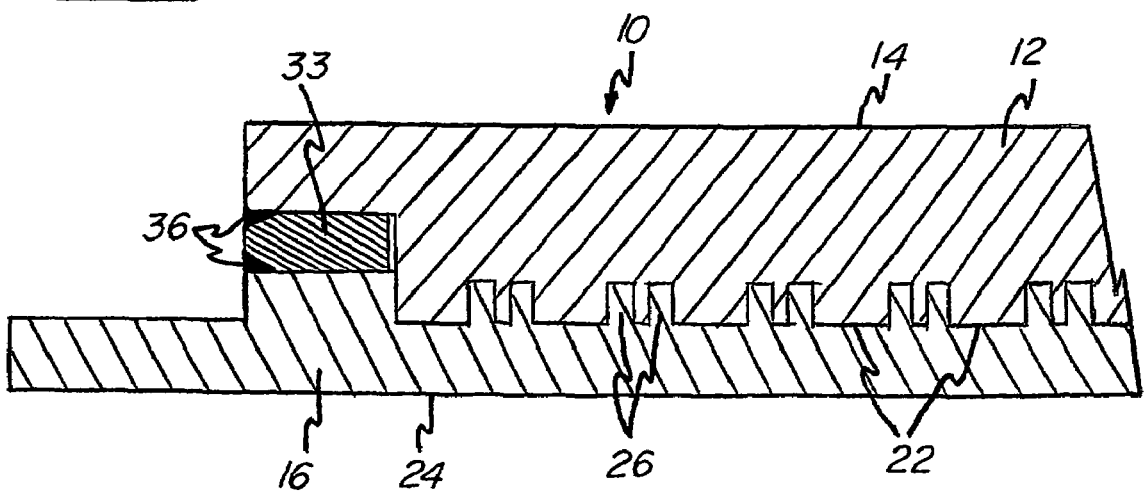
FIG. 4 is a schematic cross sectional view of the assembly shown in FIG. 2 in the mating or joined position.

A backing plate 16 is provided under the target 12, with the mating surface 18 of the target 12 adapted to mate with the mating surface 20 of the backing plate 16 to define an interfacial surface area 22 (FIGS. 3 and 4). Commonly, a heat exchange fluid (not shown) such as water is circulated adjacent the bottom side 24 of the backing plate 16 so as to cool the assembly 10 during its sputtering operation.

As shown in the FIG. 1 embodiment a plurality of cylindrical male projections 26 are machined into the mating surface 20 of the backing plate 16, and the mating surface 18 of the target plate 12 is provided with corresponding cylindrical female grooves 32 of smaller diameter than the diameter of the male projections 26.

In some cases, it is desired to provide an insert 33, in the form of a ring or the like, adjacent the peripheral boundary 34 of the assembly 10 between the target 12 and backing plate 16. The insert 32 enhances bonding of the target 12 to the backing plate 16.

The assembly 10 is first bonded along an annular band or zone adjacent 36 (FIGS. 3 and 4) the peripheral boundary 34. This initial bonding along the annular zone 36 of the assembly 10 maybe achieved by conventional means such as by E-beam welding under vacuum conditions, TIG welding, and friction welding and the like. Preferably, the bonding of the peripheral boundaries 34 of the target 12 and backing plate 16 is performed via E-beam welding under vacuum conditions.

After the peripheral bonding, the assembly 10 is consolidated, via pressure application thereto, at pressure of about 50 tons–5,000 tons; preferably less than about 1,000 tons, under low temperature conditions preferably of about room temperature to about 38° C. The male projections 26 are friction fit into the corresponding female grooves 32. The locking joint of the invention can therefore be described as a friction fit joint formed between a male projection 26 and a corresponding female groove 32. The artisan further will appreciate that the peripheral bonding can occur after pressure consolidation.

After the low temperature pressure consolidation, the assembly 10 may be subjected to a low temperature annealing step conducted at temperatures of about room to 400° F. for a period of 0.5 to 4 hours. This will help ensure adequate adhesion of the pressure consolidated surfaces.

The phrase "low temperature pressure consolidation" refers to pressure consolidation that may occur at temperatures of less than about 50% of the melting temperature of the lower melting member of the target and backing plate. Preferably, this temperature is less than about 200° C.; most preferably at about room temperature up to about 38° C.

Figure 2:
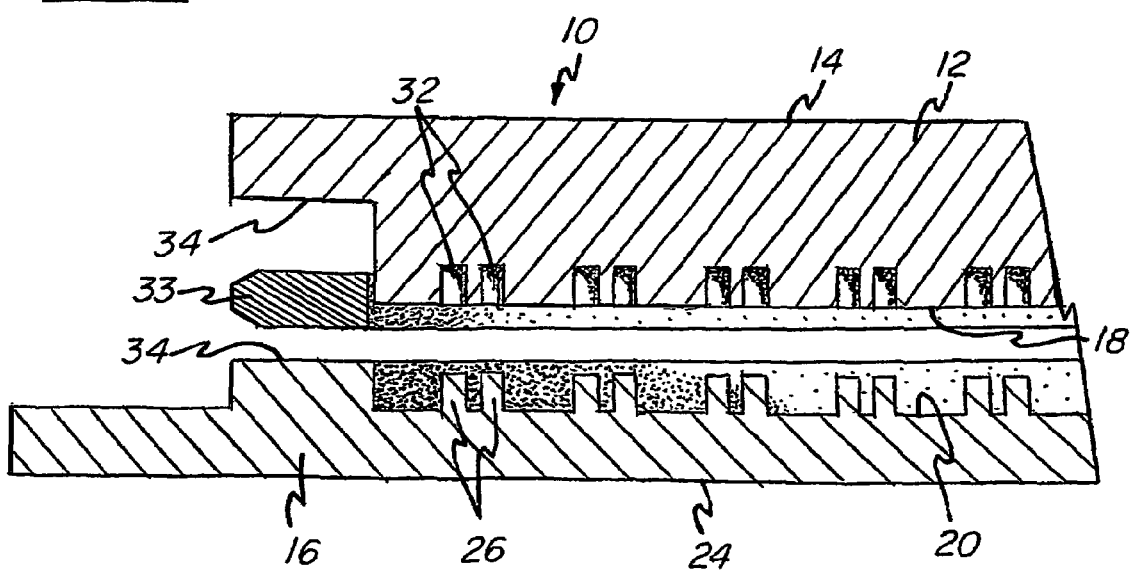
FIG. 2 is a schematic cross section showing another embodiment of the joining members having square male projections in one member and correspondingly square shaped recesses formed in the other member.

Turning now to FIG. 2, there is shown another embodiment of the invention wherein the target 12 and backing plate 16 may be joined by low temperature pressure consolidation. Here, the male projections 26 are in the form of elongated square cross sectioned members that are force fit into square female grooves 32 formed in the target plate 12.

FIGS. 3 and 4 show the assemblies 10 of FIGS. 1 and 2, respectively in their mated positions in which, by reason of the low temperature pressure consolidation, the male projections 26 are frictionally free fit in their mating, female grooves 32 and in which the target 12 and backing plate 16 are bondingly joined.

Figure 5:
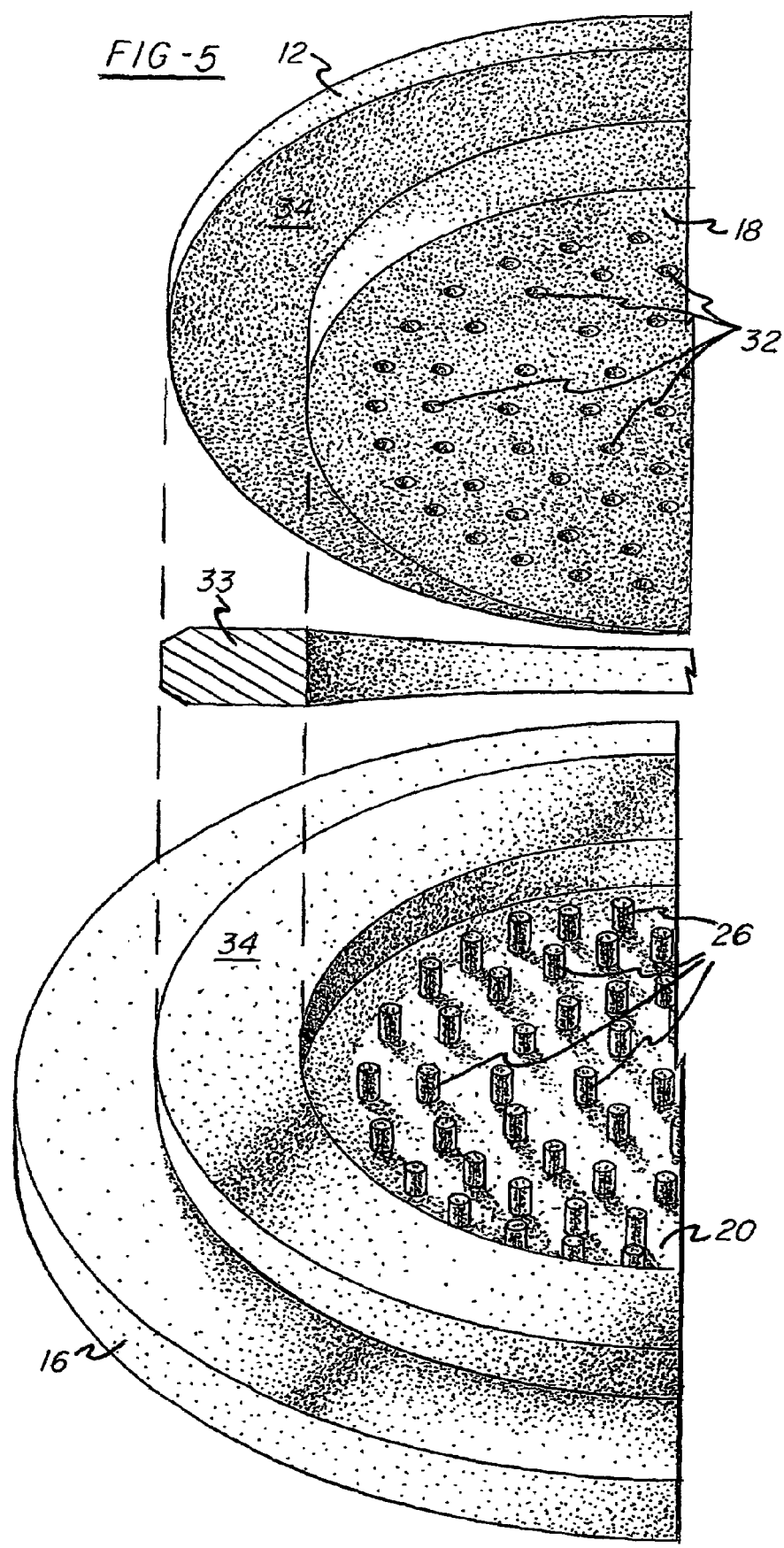
FIG. 5 is a partially exploded perspective view of the assembly of FIG. 1 before bonding.

FIG. 5 shows, in perspective, the male projections 26 and female grooves 32 of the FIG. 1 embodiment. Male projections 26 are in the form of a cylindrical dowel-like projection adapted for mating with the cylindrical female grooves 32.

The female grooves 32 have a smaller inner diameter than the outer diameter of the projecting male projections 26. As shown, the male projections 26 and the female bores 32 are arranged in a pattern of concentrically arranged annular rows.

Figure 6:
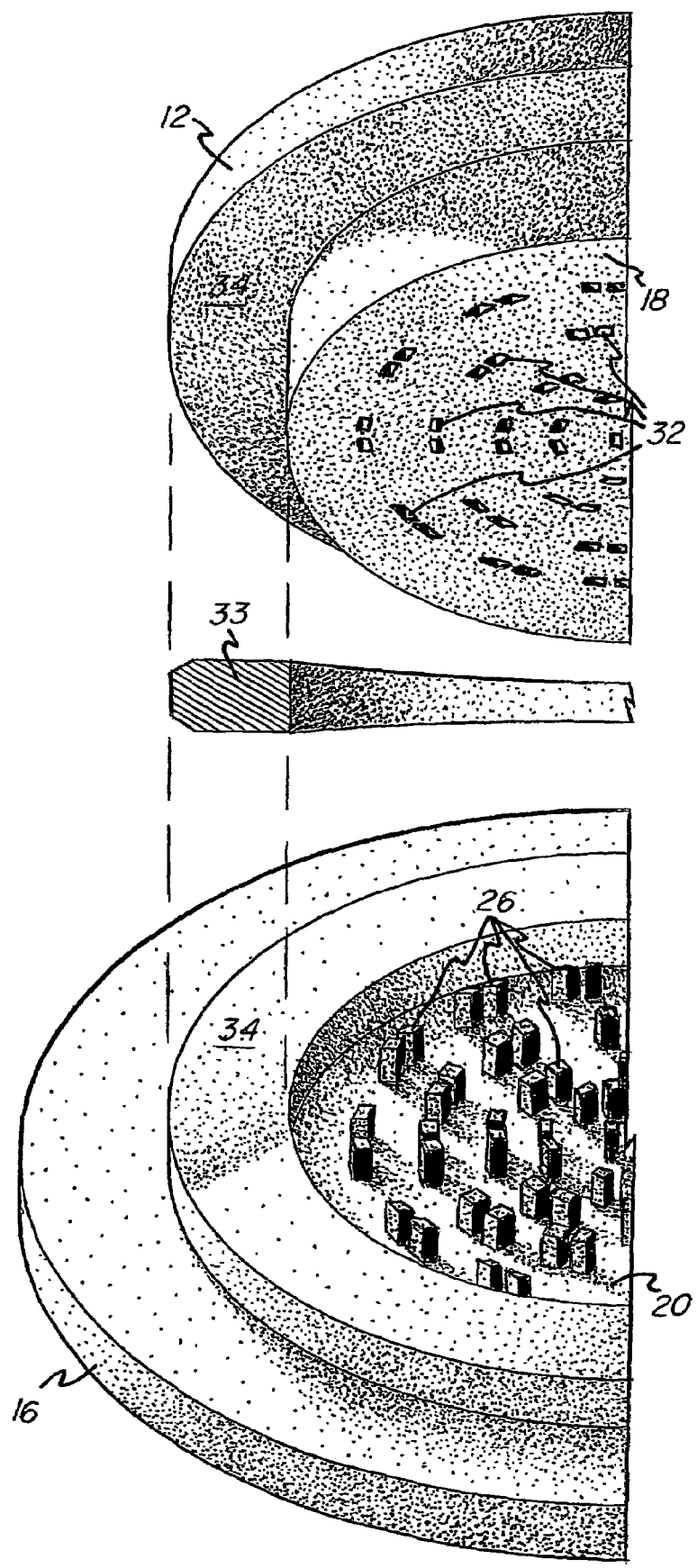
FIG. 6 is a partially exploded perspective view of the assembly of FIG. 2 before bonding.

FIG. 6 depicts the male projections 26/female grooves 32 shown in the FIG. 2 embodiment. Here, the male projections 26 are in the form of elongated square cross-sectioned studs adapted for reception into the smaller female bores 32.

This bonding method enables consolidation of unconventional sputter target/backing plate assemblies 10. These sputter target/backing plate assemblies 10 are unconventional insofar as they comprise targets 12 and backing plates 16 having dissimilar thermal expansion coefficients. An optional metal insert 33 may be placed between the target 12 and backing plate 16 to assist in bonding the assembly 10. Although the consolidated targets 12 and backing plates 16 have dissimilar thermal expansion coefficients, these unconventional assemblies 10 are able to be bonded together and used at high sputtering temperatures without bowing or bending. Further, these unconventional sputter target assemblies 10 are able to utilize backing plates 16 having higher thermal and lower electrical conductivity then the conventional backing plates normally associated with a specified target metal 12.

Additionally, the present invention further provides advantages over diffusion bonding and other joining techniques that require higher temperatures in the consolidation since this low temperature method keeps grain growth in the target metal 12 at a minimum.

The invention will be described further in conjunction with the ensuing examples which are not to be construed as limitations to the inventions but instead are illustrative of specific embodiments of the invention.

EXAMPLE 1

An unconventional sputter target assembly was bonded in accordance with the invention as shown in FIGS. 1 and 2. The target was composed of high purity Ti and the backing plate was composed of Cu-1% Cr. The thermal expansion coefficients of the target and backing plate respectively are about 8.9 and 17.6. The male projections were provided in the backing plate with each projection having a height of about 0.05". An insert comprising Cu—Ni, preferably having 1–50% Ni, was positioned adjacent the peripheral boundary of the assembly. The annular zone around the peripheral boundary of the assembly was E-beam welded under vacuum. Then, the assembly was pressure consolidated at room temperature such that the overall thickness of the assembly decreased by about 0.1".

Although the thermal expansion coefficients of the target and backing plate are dissimilar, the bonded assembly does not separate and/or bow during high power level sputtering conditions enabling this assembly to utilize a backing plate having higher thermal conductivity and lower electrical conductivity then conventional assemblies which use Ti or Ti alloy targets.

EXAMPLE 2

An unconventional sputter target assembly was bonded in accordance with the invention as shown in FIGS. 1 and 2. The target was composed of high purity Ti with the backing plate composed of Cu—Ni, preferably having 1–50% Ni. The male projections were provided in the backing plate with each projection having a height of about 0.1". No insert was used. The annular zone around the peripheral boundary of the assembly was E-beam welded under vacuum. Then, the assembly was pressure consolidated at room temperature such that the overall thickness of the assembly decreased by about 0.1".

The Cu—Ni backing plate has low electrical conductivity which decreases the eddy current and has higher heat conductivity then conventional backing plates used in high power applications wherein the target consists of Ti or Ti alloys. Although the thermal expansion coefficients are dissimilar, the bonded assembly, similar to example 1,does not separate and/or bow during high power level sputtering conditions enabling this assembly to utilize a backing plate having higher thermal conductivity and lower electrical conductivity then conventional assemblies which use Ti or Ti alloy targets.

EXAMPLE 3

Another unconventional sputter target assembly that can be bonded in accordance with the invention, as shown in FIGS. 1 and 2, includes a target composed of high purity Co and a backing plate composed of Cu-1% Cr. Male projections are provided in the backing plate with each projection having a height of about 0.1". An insert comprising NiV is positioned adjacent the peripheral boundary of the assembly. The annular zone around the peripheral boundary of the assembly is E-beam welded under vacuum. Then, the assembly is pressure consolidated at room temperature such that the overall thickness of the assembly decreases by about 0.1".

Although the thermal expansion coefficients are different, the bonded assembly does not separate and/or bow during high power level sputtering conditions enabling this assembly to utilize a backing plate having higher thermal conductivity and lower electrical conductivity then conventional assemblies which use Co or Co alloy targets.

EXAMPLE 4

Another unconventional sputter target assembly that can be bonded in accordance with the invention, as shown in FIGS. 1 and 2, includes a target composed of high purity Ta and a backing plate composed of Ti or Ti alloys. Male projections are provided in the backing plate with each projection having a height of about 0.1". No insert was used. The annular zone around the peripheral boundary of the assembly was E-beam welded under vacuum. Then, the assembly was pressure consolidated at room temperature such that the overall thickness of the assembly decreased by about 0.1".

Again, similar to the above examples, although the thermal expansion coefficients are different, the bonded assembly does not separate and/or bow during high power level sputtering conditions enabling this assembly to utilize a backing plate having higher thermal conductivity and lower electrical conductivity then conventional assemblies which use Ta or Ta alloy targets.

While the methods described herein, and the target/backing plate assemblies produced in accordance with the methods, have been described with certain specific forms and certain modifications thereof, it will be appreciated that a wide variety of other modifications can be made without departing from the scope and spirit of this invention as defined in the appended claims. It is also to be kept in mind that reference to a metal or metal component herein also includes reference to alloyed forms of the stated metal.

The invention claimed is:

1. In a method of preparing a bonded sputter target/backing plate assembly comprising a target composed of a metal or alloy to be sputtered and an underlying metallic backing plate member, the method for joining said target and backing plate along mating surfaces thereof, comprising:
   a) forming a plurality of male projections in at least one of said mating surfaces and a plurality of female grooves in said other of said mating surfaces;
   b) positioning said target and backing plate adjacent each other, the target and backing plate having an interface defined by said mating surfaces, said target comprising material selected from the group consisting of Ti, Co, Ta and alloys thereof, and said backing plate selected from the group consisting of CuCr, Ti, Ti alloy, Cu, and CuNi; and
   c) pressure consolidating said assembly under low temperature conditions of less than about 100OC so that said male projections are friction tit into said female grooves, and
   d) bonding said assembly proximate a peripheral boundary of said assembly, and further includes interposing an insert between the target and backing plate proximate the peripheral boundary of said assembly prior to bonding.

2. Method as recited in claim 1 wherein said step d) is performed after said step b) and before said step c).

3. Method as recited in claim 2 wherein said step d) comprises e-beam welding of said assembly.

4. Method as recited in claim 1 wherein said step d) comprises e-beam welding said target and said backing plate along an annular zone located adjacent said peripheral boundary.

5. Method as recited in claim 1 further comprising e) low temperature annealing said pressure consolidated assembly.

6. Method as recited in claim 1 wherein said insert comprises Cu—Ni and said target comprises Ti.

7. Method as recited in claim 6 wherein said insert comprises 1–50% Ni.

8. Method as recited in claim 1 wherein said insert comprises NiV and said target comprises Co.

9. Method as recited in claim 1 wherein said backing plate comprises 1–50% Ni.

* * * * *

UNITED STATES PATENT AND TRADEMARK OFFICE
CERTIFICATE OF CORRECTION

PATENT NO. : 7,114,643 B2 Page 1 of 1
APPLICATION NO. : 10/433242
DATED : October 3, 2006
INVENTOR(S) : Eugene Y. Ivanov and Harry W. Conard It is certified that error appears in the above-identified patent and that said Letters Patent is hereby corrected as shown below:

Column 7, line 17, please correct "1000C" to --100°C--

Column 7, line 19, please correct "tit" to --fit--.

Signed and Sealed this

Twelfth Day of December, 2006

JON W. DUDAS
*Director of the United States Patent and Trademark Office*